United States Patent [19]
Oda et al.

[11] Patent Number: 5,192,370
[45] Date of Patent: Mar. 9, 1993

[54] METHOD AND APPARATUS FOR FORMING THIN FILM

[75] Inventors: Masao Oda; Tatsuya Iwasa, both of Hyogo, Japan

[73] Assignee: Mitsubishi Denki Kabushiki Kaisha, Tokyo, Japan

[21] Appl. No.: 542,148

[22] Filed: Jun. 22, 1990

[30] Foreign Application Priority Data

Sep. 5, 1989 [JP] Japan .................................. 1-229951

[51] Int. Cl.$^5$ ........................................... H01L 21/00
[52] U.S. Cl. ................................... 118/723; 118/715; 156/345
[58] Field of Search .................. 118/723, 715; 156/345

[56] References Cited

U.S. PATENT DOCUMENTS

| | | | |
|---|---|---|---|
| 4,633,809 | 1/1987 | Hirose et al. | 118/723 |
| 4,676,195 | 6/1987 | Yasui et al. | 118/730 |
| 4,962,727 | 10/1990 | Harada | 118/723 |

FOREIGN PATENT DOCUMENTS

| | | |
|---|---|---|
| 53-62982 | 11/1978 | Japan . |
| 62-298106 | 12/1987 | Japan . |
| 63-258017 | 10/1988 | Japan . |

OTHER PUBLICATIONS

R. L. Jackson et al., "Afterglow Chemical Vapor Deposition of SiO$_2$", Solid State Technology, Apr. 1987, pp. 107–111.

B. Robinson et al., "High Quality Deposition of SiO$_2$ Downstream From a Microwave Discharge", Mat. Res. Soc. Symp. Proc. vol. 98, 1987 Materials Research Society, pp. 313–319.

G. Lucovsky et al., "Deposition of Silicon-Based Dielectrics by Remote Plasma-Enchanced Chemical Vapor Deposition", Journal of Crystal Growth 86 1988, pp. 804–814.

Primary Examiner—Brian E. Hearn
Assistant Examiner—George Goudreau
Attorney, Agent, or Firm—Rothwell, Figg, Ernst & Kurz

[57] ABSTRACT

Method of forming a thin film on a substrate by CVD (Chemical Vapor Deposition) method and an apparatus therefor, wherein a first gas is supplied from a reaction gas supply port in a reaction chamber, and an active species produced by exciting a second gas are supplied from an active species supply port in the reaction chamber, and a thin film is formed on the substrate by reaction of the first reaction gas and the active species, since a metal porous plate having a number of small holes is installed close to the substrate between the active species supply port and a heater so as to enclose at least the substrate and the active species supply port, the precursor forming reaction is limited to position on the surface of the substrate and diffusion of the precursor to the outer circumferential portion and the inner wall of the reaction chamber is prevented, thereby the low dust producing process to advance the thin film forming reaction is obtained without generating the reaction product of fine particle form which may cause the dust producing.

4 Claims, 6 Drawing Sheets

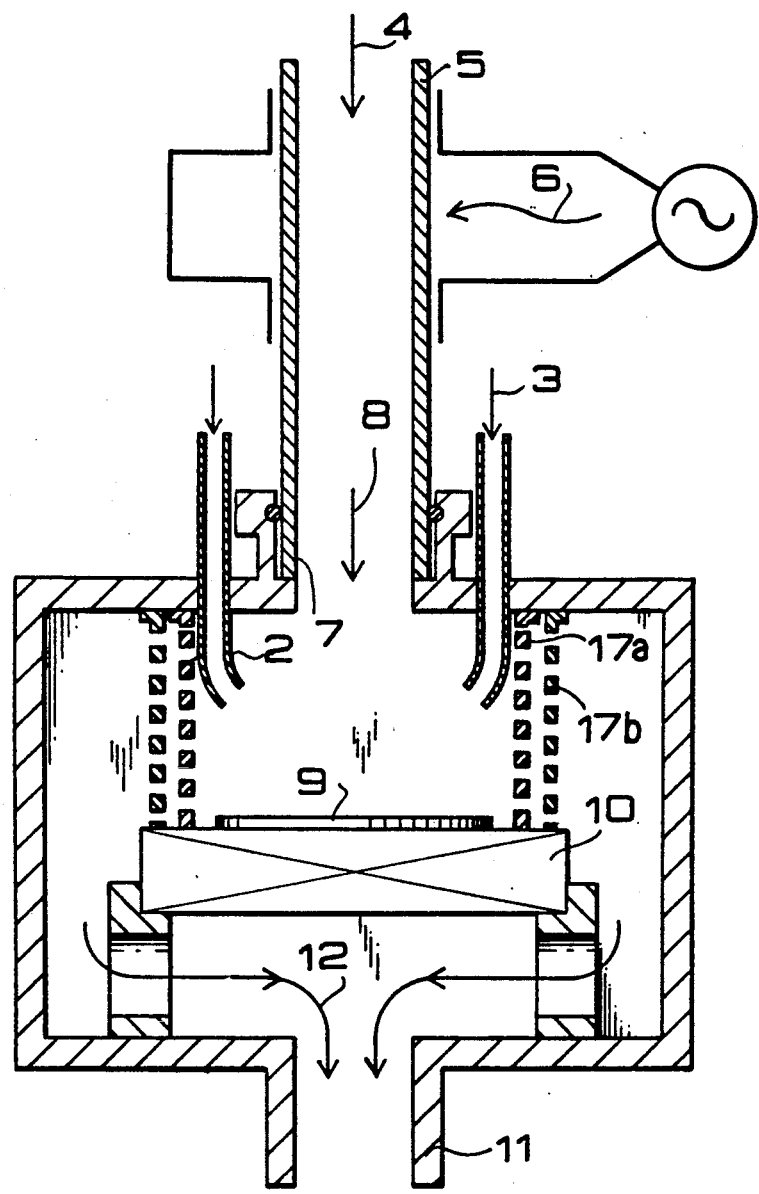

METHOD AND APPARATUS FOR FORMING THIN FILM

BACKGROUND OF THE INVENTION

1. Field of the Invention

The present invention relates to a method of forming a thin film on a substrate and an apparatus therefor, and more particularly to improvement of a method of forming a thin film by a CVD (Chemical Vapor Deposition) method and an apparatus therefor.

2. Description of the Prior Art

In recent years, since manufacturing process for electronic devices including LSIs (large scale integrated circuits) and liquid crystal displays are effected at low temperature and low damage, attention is drawn to the afterglow microwave plasma CVD method of forming a thin film on a substrate at low-temperature conditions. The afterglow microwave plasma CVD method is technology where a reaction gas is excited by microwave plasma discharge in a plasma discharge chamber separated from a reaction chamber, and active species thus produced are and deposited onto a substrate heated to low temperature in the reaction chamber whereby a thin film is formed. In this method, since the substrate is not exposed directly to the plasma, charged particles in the plasma do not damage the substrate or the thin film being formed, and the thin film can be formed at the substrate temperature as low as 300° C. or less.

FIG. 1 shows a sectional view of a thin film forming apparatus to be used in the afterglow microwave plasma CVD method according to the prior art, for example, as disclosed in Japanese patent application laid-open No. 27656/1983.

In FIG. 1, numeral 1 designates a reaction chamber, 2 a first reaction gas supply port, 3 a first reaction gas, 4 a second reaction gas, 5 a microwave plasma discharge tube, 6 microwave energy, 7 an active species supply port, 8 active species, 9 a substrate, 10 a heater on which the substrate 9 is held, 11 a gas exhaust port, and 12 an exhaust gas.

Next, the operation will be described. In the thin film forming apparatus constituted as above described, for example, when a silicon oxide film is formed, a silane gas 3 as the first reaction gas is supplied from the reaction gas supply port 2 into the reaction chamber 1, and gas 4 including oxygen atoms as the second reaction gas is supplied to the microwave plasma discharge tube 5 the activated oxygen atoms 8 thus produced are supplied from the active species supply port 7 into the reaction chamber 1.

Then the activated oxygen atoms 8 produce vapor phase chemical reaction with the silane gas 3 within a space in the vicinity of the substrate, and form a precursor gas which contains silicon atoms, hydrogen atoms and oxygen atoms. The precursor is contacts the surface of the substrate 9 and a silicon oxide film.

FIG. 2 is an enlarged view of a reaction chamber 1 of a thin film forming apparatus to be used in the afterglow microwave plasma CVD method of the prior art. In such a thin film forming apparatus, active species 8 supplied from the active species supply port 7 into the reaction chamber 1 do not stagnate in the vicinity of the surface of substrate 9, but are diffused to an outer circumferential portion of the substrate 9 and further in the vicinity of an inner wall of the reaction chamber 1, where the active species 8 react with first reaction gas molecules 3 diffused in similar manner and forms a precursor 13.

A part of the precursor 13 formed in the vicinity of the surface of the substrate 9 also diffuses to the vicinity of the inner wall of the reaction chamber. The precursor 13 does not take part in the thin film forming reaction, but is contacts with a surface at low temperature, for example, the inner wall of the reaction chamber and forms a reaction product 14 of fine particle form. In the prior art, the reaction product 14 becomes dust and floats in the reaction chamber and may be taken into the thin film or adhere to the surface of the thin film, thereby interferring with the information of a thin film of high quality.

The afterglow microwave plasma CVD method is characterized in that when the precursor 13 is formed by the chemical reaction of the active species 8 with the first reaction gas molecules 3, it is accompanied by chemical luminescence. Since the chemical luminescence intensity has is correlated with the thin film forming rate, the measurement of luminescence intensity through an optical fiber 15 using a spectrophotometer 16 thereby permits in-situ monitoring of the thin film forming rate. In the thin film forming apparatus of the prior art, however, during measuring the chemical luminescence intensity, since the forming reaction of the precursor 13 is not limited a position on the surface of the substrate 9 as shown in FIG. 2, in addition to the necessary measurement of the integrated intensity of the chemical luminescence within the substrate diameter Lw the luminescence intensity outside the substrate (Lc-Lw) not taking part in the thin film forming reaction is also measured, thereby making it difficult to perform the in-situ monitoring of the thin film forming rate at high precision.

SUMMARY OF THE INVENTION

In order to solve the above-mentioned problems in the prior art, a main object of the invention is to provide a method of forming a thin film together with an apparatus therefor wherein a low dust-producing process and a high precision in-situ monitoring of process are enabled in the afterglow microwave plasma CVD method.

Another object of the invention is to provide method of forming a thin film and an apparatus therefor wherein structure is simple and the cost is low and wherein of the prevention of dust production is superior to that of the prior art.

Still another object of the invention is to provide method of forming a thin film and an apparatus therefor the structure is simple the cost is low and wherein chemical luminescence is produced only on the substrate such that in-situ monitoring of high precision is possible.

In order to attain the above objects, in accordance with a method of forming a thin film and an apparatus therefor according to the present invention, a substrate is enclosed and positioned adjacent to a heater within a reaction chamber and heated to about 300° C., a first reaction gas is supplied from a reaction gas supply port within the reaction chamber, active species produced by exciting a second reaction gas are supplied from an active species supply port within the reaction chamber, and a thin film is formed on the substrate by the reaction of the first reaction gas with the active species, wherein a metal porous plate having a number of small holes being installed close to the substrate between the active species supply port and the heater so as to enclose at least the substrate and the active species supply port, and the precursor forming reaction is the limited to a position on the surface of the substrate to limit diffusion of the precursor to the outer circumferential portion of the substrate the an inner wall of the reaction chamber and thereby suppress the reaction product of fine particle form that would otherwise be generated, thereby preventing dust production and advancing formation of the thin film. Also in the present method of forming a thin film and an apparatus therefor, the chemical luminescence is produced only on the substrate and in-situ monitoring of high precision is therefore possible.

The foregoing and other objects as well as novel features of the invention will more fully appear from the following detailed description when the same is read in connection with the accompanying drawings. It is to be expressly understood, however, that the detailed description and drawings are for purposes of illustration only and are not intended to define the limits of the invention.

BRIEF DESCRIPTION OF THE DRAWINGS

FIG. 5 is a sectional constitution diagram illustrating the inside of a thin film forming apparatus as a second embodiment of the invention;

DETAILED DESCRIPTION OF THE PREFERRED EMBODIMENTS

Preferred embodiments of the invention will now be described in detail referring to the accompanying drawings.

Figure 3:
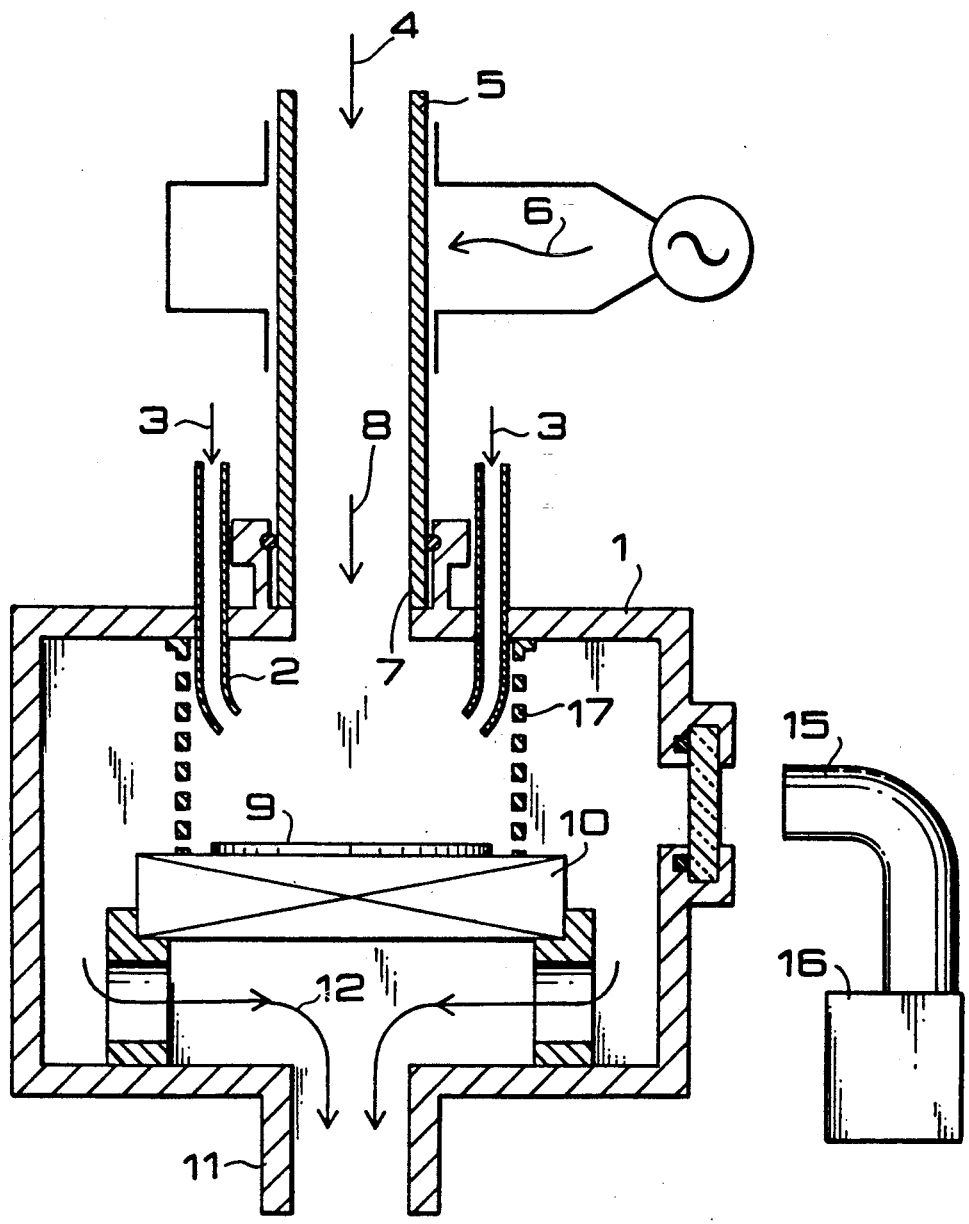
FIG. 3 is a sectional diagram illustrating the inside of a thin film forming apparatus as a first embodiment of the invention.
Figure 4:
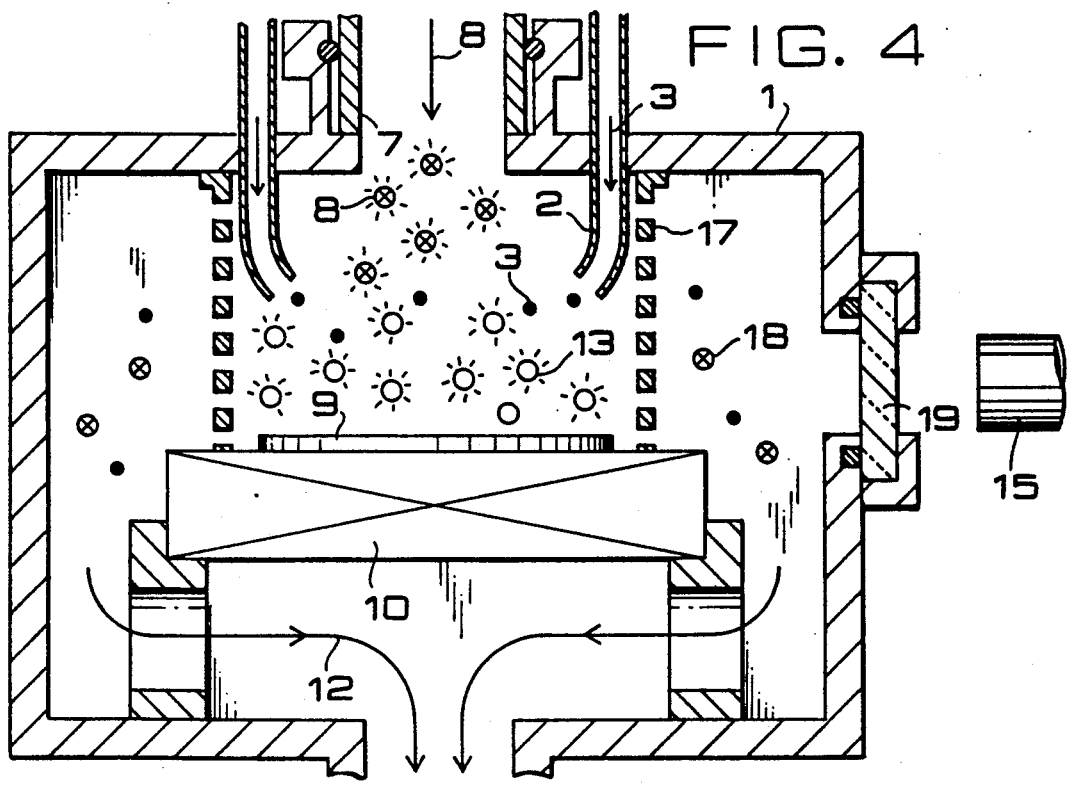
FIG. 4 is a sectional diagram illustrating the inside of the reaction chamber of FIG. 3.

FIG. 3 is a sectional diagram illustrating the inside of a thin film forming apparatus as a first embodiment of the invention, and FIG. 4 shows a sectional constitution diagram illustrating the inside of the reaction chamber of FIG. 3.

Figure 1:
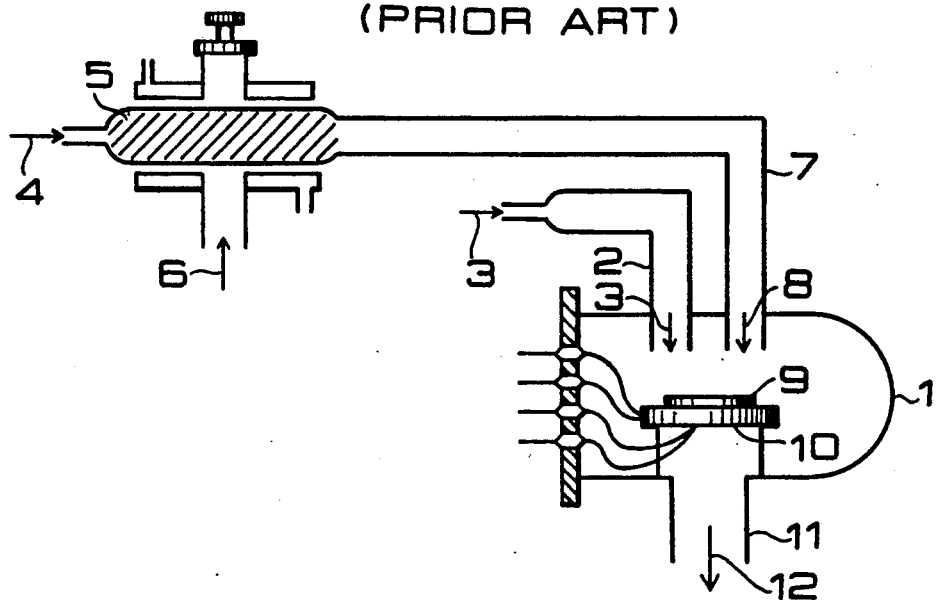
FIG. 1 is a sectional diagram illustrating the constitution of a thin film forming apparatus in the prior art.
Figure 2:
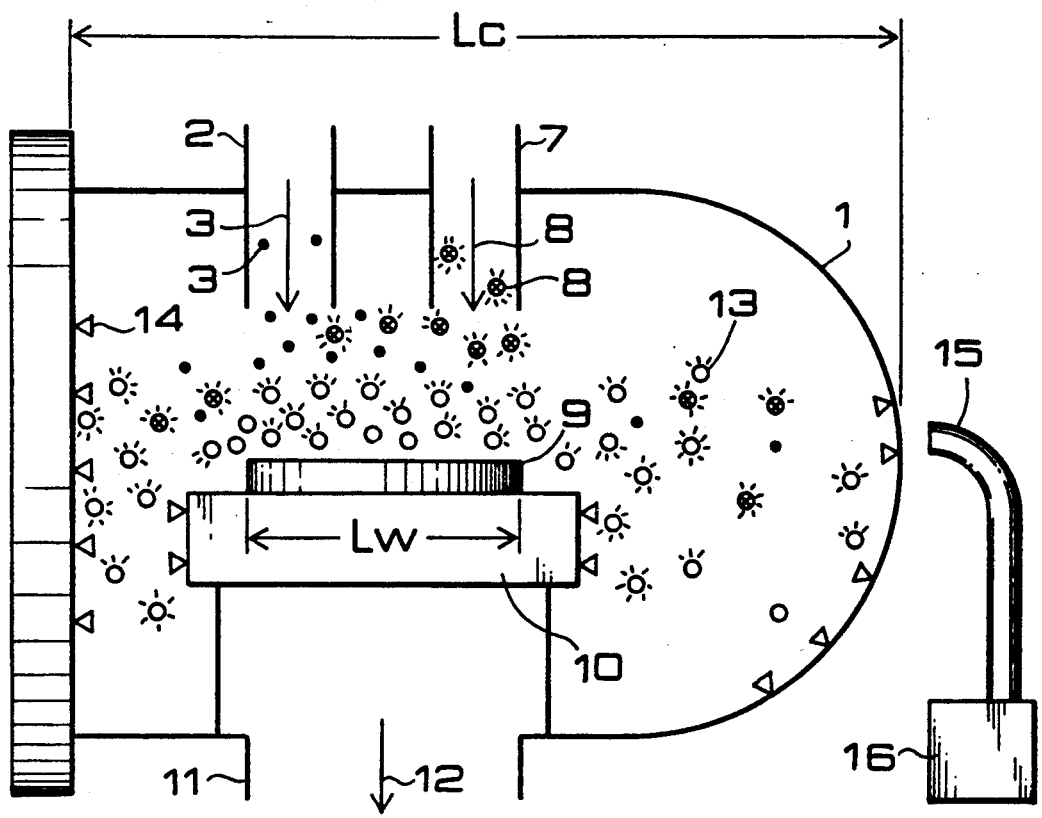
FIG. 2 is a sectional constitution diagram illustrating the inside of the reaction chamber of FIG. 1.

In FIG. 3, like parts to those of FIG. 1 are designated by the same reference numerals. A metal mesh plate 17 having a number of small holes is installed close to a substrate 9 between an active species supply port 7 and a heater 10 so as to enclose the substrate 9, the active species supply port 7 and a reaction gas supply port 2. The size of each hole of the metal mesh plate 17 is determined mainly depending on pressure within the reaction chamber 1. Since the inside of the reaction chamber 1 is electrically neutral, the thin film forming apparatus using the afterglow microwave plasma CVD method does not produce abnormal discharge whatever form of the metal plate is installed within the reaction chamber.

Figure 9:
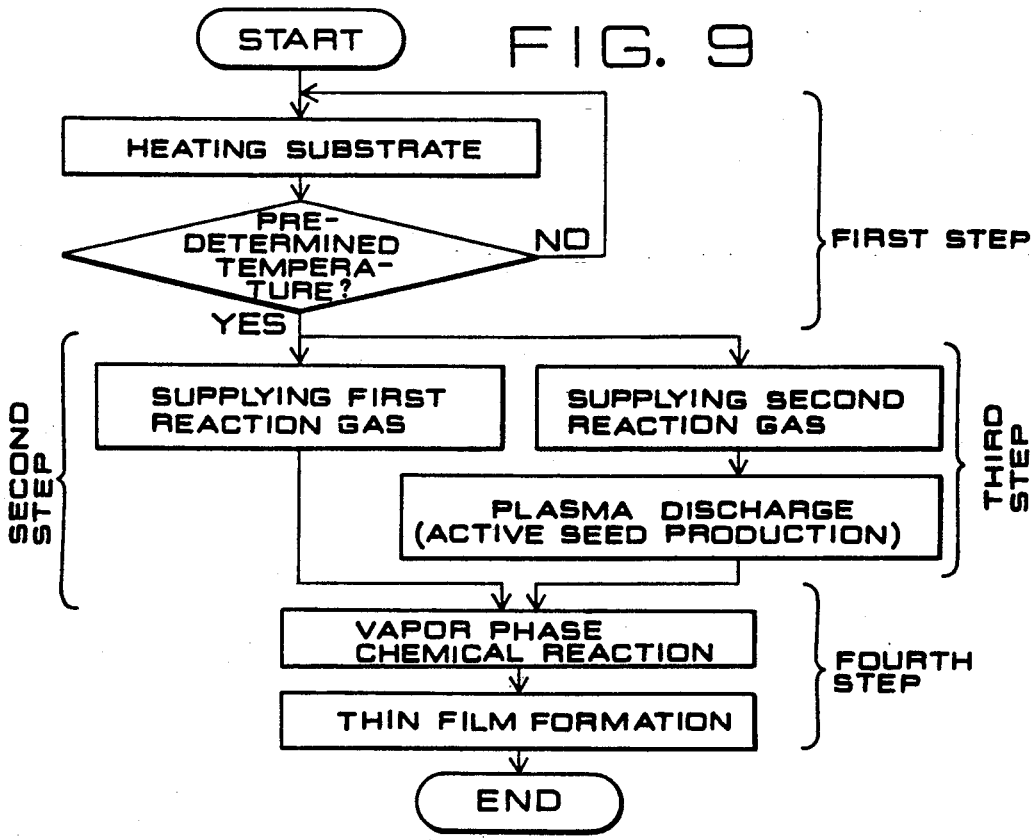
FIG. 9 is a flow chart illustrating method of forming a thin film of the invention.

In a thin film forming apparatus of the embodiment as shown in the flow chart of FIG. 9, a film is formed in a first step of heating the substrate to about 300° C. in a manner similar to a conventional apparatus, a second step of supplying a silane gas 3 a first reaction gas from the reaction gas supply port 2 onto the substrate 9, a third step of supplying a gas 4 including oxygen atoms as a second reaction gas to a microwave plasma discharge tube 5 and of introducing the active species thus produced, i.e., activated oxygen 8 from an active species supply port 7 onto the substrate 9, and a fourth step of forming a precursor 13 by the vapor phase chemical reaction of the activated oxygen 8 and the silane gas in a space in the vicinity of the substrate to form a silicon oxide film by the chemical reaction of the precursor 13 on the surface of the substrate 9. As shown in FIG. 4, the portion of the activated oxygen 8 supplied to the inside of the reaction chamber which is diffused to the outer circumferential portion of the substrate 9 loses energy by collision with the metal surface of the metal porous plate 17 and becomes de-activated oxygen 18 at the ground state and passes through the holes. The portion of the precursor 13 diffuses to the outer circumferential portion of the substrate 9 contacts the metal porous plate 17, and since the metal porous plate 17 exists in the vicinity of the heater and has a temperature relatively close to the substrate temperature, the diffused precursor becomes a thin film on the metal porous plate 17. That is, the precursor 13 which diffuses to the outer circumferential portion of the substrate without taking part in the thin film forming reaction on the substrate 9 becomes a film secured to the metal porous plate 17.

In such constitution, as above described, the portion of the activated oxygen 8 which diffuses to the outer circumferential portion of the substrate 9 loses energy by the collision with the metal surface of the metal porous plate 17 and becomes the de-activated oxygen 18 and passes through the number of holes, such that the probability of existence of activated oxygen 8 required for the precursor forming reaction becomes quite low outside the metal porous plate 17 enclosing the substrate 9. Consequently, the production of precursor 13 also becomes quite low and in the prior art the precursor 13 adheres to the wall of the reaction chamber at low temperature relatively close to the room temperature to thereby produce a reaction product 14 of fine particle form, the amount of such reaction product 14 of fine particle form can is reduced in the present invention the manner just described. Also in the above-mentioned constitution, since the generation of the chemical luminescence accompanying the precursor forming reaction is limited to the surface of the substrate, the luminescence intensity is in strong correlation with the film forming and can be measured with good accuracy through a measuring window 19 installed in the wall of the reaction chamber through the holes of the metal porous plate 17.

Figure 6:
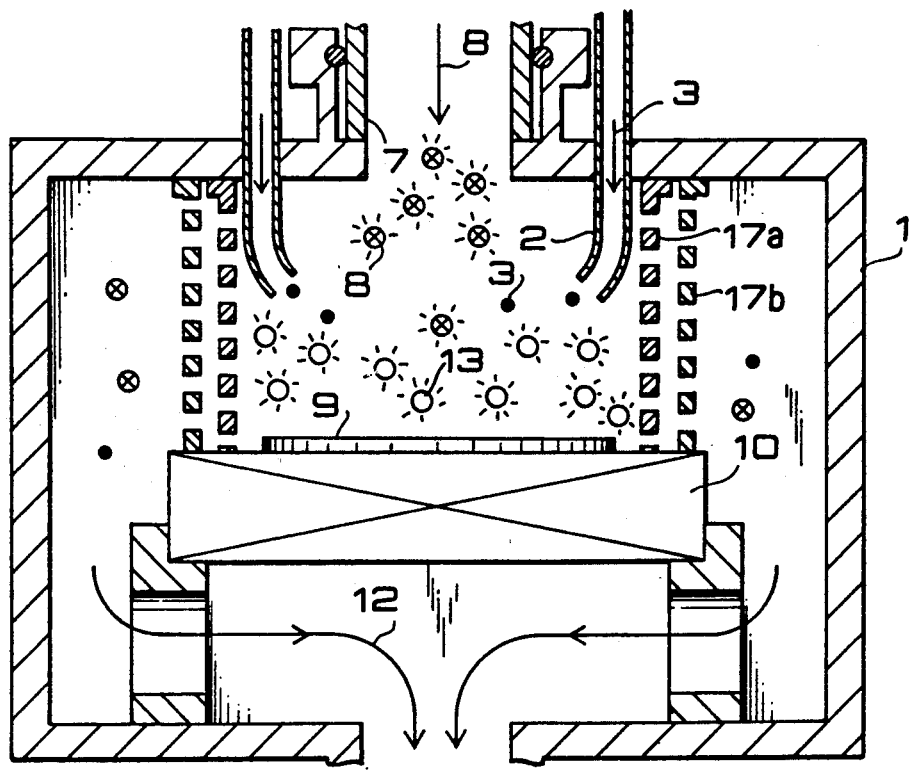
FIG. 6 is a sectional diagram illustrating the inside of the reaction chamber of FIG. 5.

Although the metal porous plate 17 is installed in single structure so as to enclose the substrate 9, the active species supply port 7 and the reaction gas supply port 2 in the foregoing embodiment, the plate 17 may be installed in a second embodiment of the invention as shown in FIG. 5 such that two metal porous plates 17 are installed to enclose the substrate 9, the active species supply port 7 and the reaction gas supply port 2 a double structure. In this case, as shown in FIG. 6, the porous positions of the metal porous plates 17a and 17b are positioned on different levels from each other, the contact probability of the active species 8 and the forerunner 13 with the metal porous plate 17 becomes high and thereby the generation of the reaction product of fine particle form is further reduced and the production is therefore low.

Figure 7:
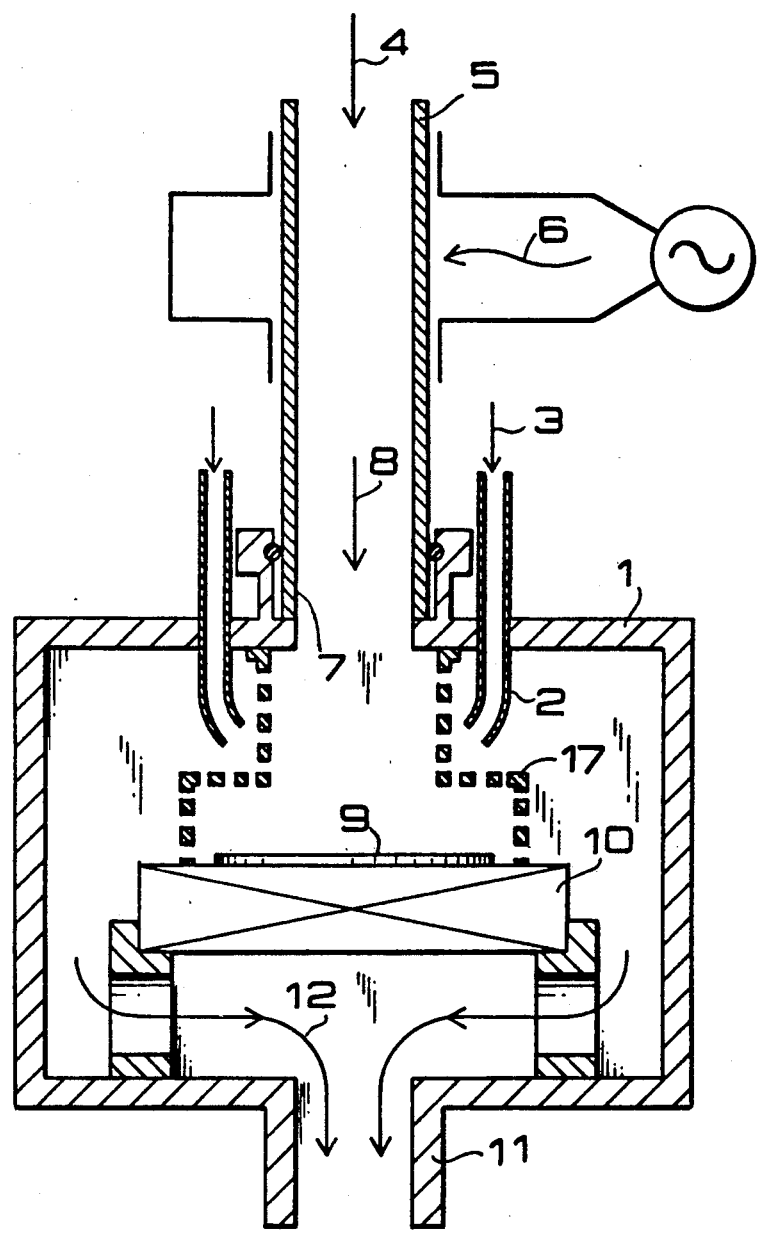
FIG. 7 is a sectional constitution diagram illustrating the inside of a thin film forming apparatus as a third embodiment of the invention.
Figure 8:
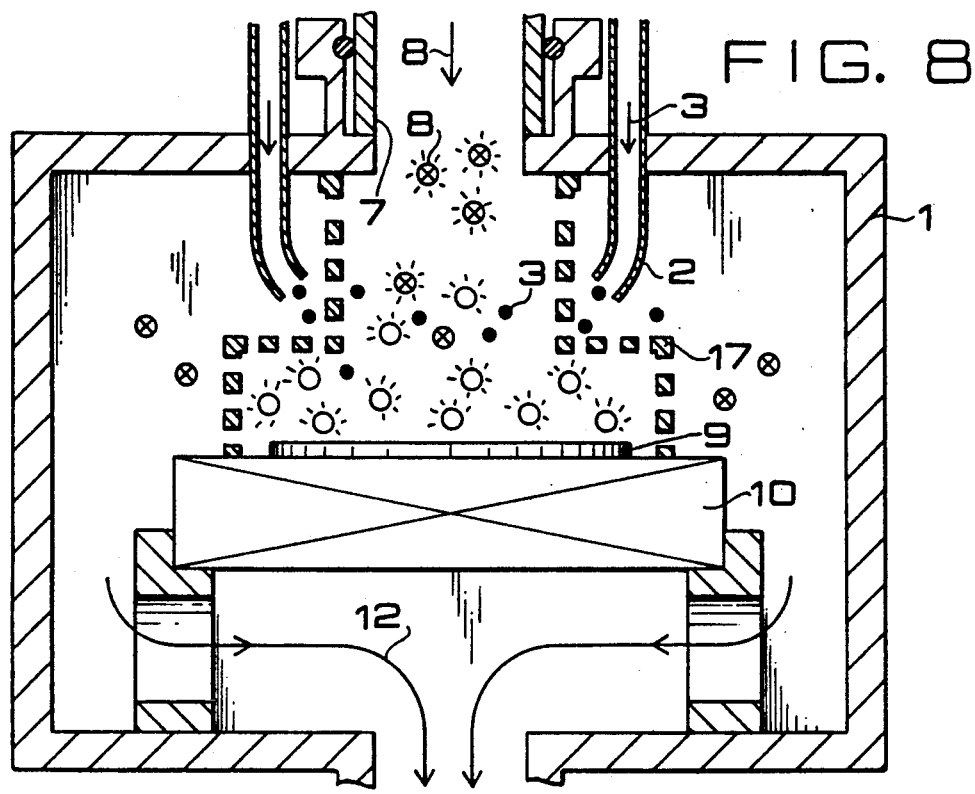
FIG. 8 is a sectional diagram illustrating the inside of the reaction chamber of FIG. 7.

Also in the embodiments as hereinbefore described, although the metal porous plate is installed so as to enclose the substrate 9 the active species supply port 7 and the reaction gas supply port 2, the plate may be installed as in a third embodiment of the invention shown in FIG. 7 so that the metal porous plate 17 encloses only the substrate 9 and the active species supply port 7. In this case, as shown in FIG. 8, the first reaction gas molecules 3 are supplied from the outside of the metal porous plate 17 through the number of holes onto the surface of the substrate.

According to the invention as above described, in a film forming apparatus provided with a reaction chamber having a substrate, a heater holding the substrate and heating it, a reaction gas supply port for supplying a first reaction gas, and an active species supply port for supplying active species produced by exciting a second reaction gas, wherein a thin film is formed on the substrate by the reaction of the first reaction gas, a metal porous plate having a number of small holes is installed close to the substrate between the active species supply port and the heater so as to enclose the substrate and the active species supply port and, the precursor forming reaction is limited to the surface of the substrate and the diffusion of the precursor to the outer circumferential portion of the substrate and the inner wall of the reaction chamber is prevented, thereby the invention has effect that a low dust producing process for advancing the thin film forming reaction can be obtained without producing the reaction product of fine particle form which causes the dust producing. Also since the chemical luminescence is produced only on the surface of the substrate, the invention permits high precision in-situ monitoring of the process.

What is claimed is:

1. A thin film forming apparatus wherein a substrate is enclosed, and a first reaction gas and an active species produced by separately exciting a second reaction gas are introduced into a reaction chamber provided to form a thin film on the surface of the substrate, said reaction chamber comprising:
   a heater means for holding said substrate and heating it to a prescribed temperature;
   a reaction gas supply port provided with an opening for directing the first reaction gas towards said substrate and supplying the reaction gas thereto;
   an active species supply port provided with an opening for directing the active species of a separately excited second reaction gas toward said substrate and supplying the active species thereto separately from said first reaction gas; and
   a metal porous plate having a number of small holes therein installed between said active species supply port and said heater means so as to enclose at least said substrate and said active species supply port;
   said metal porous plate having one end between said active species supply port and said reaction gas supply port so as to enclose said active species supply port and having other end so as enclosing said substrate.

2. A thin film forming apparatus as set forth in claim 1, wherein a plurality of reaction gas supply ports are installed and arranged so as to enclose said active species supply port.

3. A thin film forming apparatus as set forth in claim 1, wherein said metal porous plate is in the form of a plurality of plates arranged in double structure and at different levels from each other so that at least said active species supply port and said substrate are enclosed in double structure with a prescribed offset and the coaxial penetration between the small holes is prevented.

4. A thin film forming apparatus as set forth in claim 1, wherein a microwave discharge section is installed separate from said reaction chamber and connected to said active species supply port by means of an active species transporting tube.

* * * * *